United States Patent [19]

Hutter et al.

[11] Patent Number: 4,980,747
[45] Date of Patent: Dec. 25, 1990

[54] DEEP TRENCH ISOLATION WITH SURFACE CONTACT TO SUBSTRATE

[75] Inventors: Louis N. Hutter, Richardson; James D. Goon, Dallas; Shiu-Hang Yan, Richardson, all of Tex.; Gopal K. Rao, Veldhoven, Netherlands

[73] Assignee: Texas Instruments Inc., Dallas, Tex.

[21] Appl. No.: 259,403

[22] Filed: Oct. 18, 1988

Related U.S. Application Data

[63] Continuation of Ser. No. 945,742, Dec. 22, 1986, abandoned.

[51] Int. Cl.⁵ .................. H01L 27/040; H01L 29/040
[52] U.S. Cl. ........................ 357/50; 357/48; 357/49; 357/59
[58] Field of Search .............. 357/23.6, 48, 49, 50, 357/54, 55, 59, 59 G, 59 I, 86

[56] References Cited

U.S. PATENT DOCUMENTS

| | | | |
|---|---|---|---|
| 3,538,397 | 11/1970 | Davis | 357/48 |
| 4,353,086 | 10/1982 | Jaccodine et al. | 357/50 |
| 4,400,715 | 8/1983 | Barbee et al. | 357/49 |
| 4,454,647 | 6/1984 | Joy et al. | 357/49 |
| 4,503,451 | 3/1985 | Lund et al. | 357/55 |
| 4,528,047 | 7/1985 | Beyer et al. | 357/50 |
| 4,549,927 | 10/1985 | Goth et al. | 357/54 |
| 4,672,410 | 6/1987 | Miura et al. | 357/23.6 |
| 4,689,656 | 8/1987 | Silvestri et al. | 357/50 |
| 4,728,623 | 3/1988 | Lu et al. | 357/55 |
| 4,819,052 | 4/1989 | Hutter | 357/49 |

*Primary Examiner*—Rolf Hille
*Assistant Examiner*—Peter Toby Brown
*Attorney, Agent, or Firm*—Richard A. Stolz; James T. Comfort; Melvin Sharp

[57] ABSTRACT

A trench structure and fabrication technique is disclosed for isolating adjacent circuits in an integrated circuit. A trench (26) is coated with an oxidation barrier (18) of silicon to protect underlying semiconductor regions (34, 36) from crystal faults and dislocations caused by high temperature oxidation. The trench (26) includes a bottom (50) formed of the substrate (10). The trench (26) is filled with a conductive material which is in electrical contact with the substrate (10). A top surface contact electrode (74) is formed over the trench, in contact therewith, thereby also contacting the underlying substrate (10). For very narrow trenches, semiconductor areas (68, 70) are formed adjacent the top of the trench to thereby provide additional contact surface for the electrode (74).

5 Claims, 2 Drawing Sheets

DEEP TRENCH ISOLATION WITH SURFACE CONTACT TO SUBSTRATE

This application is a continuation of application Ser. No. 945,742, filed Dec. 22, 1986.

RELATED APPLICATION

"MERGED BIPOLAR/CMOS TECHNOLOGY USING ELECTRICALLY ACTIVE TRENCH", by Louis N. Hutter, filed concurrently herewith, Ser. No. 945,796 filed 12/22/86, attorney's.

TECHNICAL FIELD OF THE INVENTION

The present invention relates in general to semiconductor structures and methods of fabrication thereof, and more particularly relates to methods and structures for providing lateral isolation between semiconductor circuits formed on a substrate.

BACKGROUND OF THE INVENTION

The semiconductor industry continues to experience a need for higher levels of circuit integration. One approach to accomplish this goal involves scaling existing circuits such that smaller circuits are realized, thus allowing additional circuits to be integrated into a chip.

The scaling of integrated circuits to increase the packing density is accomplished by reducing the lateral dimensions of the transistor features. Generally, the various photolithographic masks are reduced in size so that the resulting circuits are also reduced in size. The scaling of P-channel (PMOS) insulated gate field effect transistors and N-channel (NMOS) transistors can be accomplished without substantial deterioration in performance, as the features of the transistors are laterally oriented at the face of the semiconductor body. While bipolar transistors can also be scaled to increase packing density, the lateral size of the device cannot be scaled as easily, as this family of devices is not a lateral-operating device, but rather depends upon the particular vertical spacing of semiconductor layers orthogonal to the face of the semiconductor body.

A major concern with scaling integrated circuits is the electrical isolation which must be maintained between the circuits. In other words, and unless otherwise desired, the electrical operation of one circuit must be independent of that of an adjacent circuit. One approach conventionally utilized for isolating circuits, especially of the bipolar type, is to form an N-type buried layer on a P-type substrate, and deposit a P-type epitaxial layer thereover. An N-well is formed in the epitaxial layer down and in contact with the buried layer. The base and emitter features of the bipolar transistor, as well as the collector contact, are formed in the N-well. The epitaxial layer surrounding the N-well is effective to isolate the bipolar transistor from adjacent circuits. This isolation technique is commonly referred to as the collector diffused isolation technology.

Another circuit isolation technique using the junction technology is commonly referred to as the standard buried collector technique. The standard buried collector technique is similar to the collector diffused isolation technique, but instead of forming a semiconductor well in the epitaxial layer, an annular P-type isolation ring is formed around an N epitaxial layer overlying the buried collector, thereby isolating the epitaxial well from adjacent circuits. The base, emitter and collector contact semiconductor regions are formed in the isolated epitaxial region.

Still another isolation technique involves the formation on an annular ring of a P-type semiconductor material surrounding and spaced apart from a buried collector. An epitaxial layer is deposited thereover, and a second P-type annular ring is formed in the epitaxial layer, overlying the bottom isolation ring. A thermal diffusing of the upper and bottom P-type isolation rings causes such rings to be joined, thereby encircling a portion of the epitaxial region and isolating it from adjacent circuits.

The disadvantage with such previously developed junction isolation techniques is that a substantial amount of lateral wafer area is required to form the isolation structures themselves. The wafer area problem encountered in utilizing junction-type isolation is further aggravated in fabricating high voltage bipolar transistors where the epitaxial layer is required to be relatively thick. In this situation, a diffused isolation region which extends from the face of the semiconductor body to the substrate also diffuses in the lateral direction to such an extent that appreciable wafer area is used. Moreover, a certain amount of "wasted" lateral area must be reserved between the isolation diffusions of adjacent circuits to prevent breakdown or "punch-through" between adjacent circuits. The wafer area required by the isolation diffusions and the wasted space may account for more than half the entire area of the circuit.

Another isolation technology conventionally employed in fabricating semiconductor circuits comprises an oxide isolation formed between circuits to be isolated. One technique utilizing oxide isolation includes masking circuit areas and selectively oxidizing through an epitaxial layer into an underlying substrate. Hence, adjacent circuits are electrically isolated by the silicon oxide. This technique is limited to the isolation of circuits formed in thin epitaxial layers. An uneven topographical surface may result when this method is attempted in conjunction with thicker epitaxial layers. In forming the isolation oxide with this technique, the oxide experiences a lateral spreading which encroaches on active circuit areas.

Another oxide isolation technique involves the formation of a deep trench anisotropically etched into the semiconductor material, and sloped etched at the upper trench corners to reduce the subsequent formation of crystal faults due to high temperature oxidation. A thin layer of silicon oxide is then formed on the trench sidewalls. A layer of silicon nitride is deposited on the trench sidewalls, and the trench is filled with polycrystalline silicon. Planarization of the wafer surface is required to form a topography suitable for subsequent masking, patterning and fabrication steps. This technique is disclosed in an article titled "Isolation Technique for High Speed Bipolar VLSI's", pp. 62–65, Vol. 82 IEEE Journal, 1982.

A major drawback associated with forming deep trenches is the damage to the silicon semiconductor material in regions adjacent the trench caused by subsequent annealing or heat treatment of the wafer, such as subsequent oxidation steps. The corners of the trench are known to be the mechanism for generating crystallographic dislocations and faults which extend substantial distances from the trench. Semiconductor circuits formed in the silicon material having these faults generally exhibit leaky PN junctions which severely deteriorate the performance of the circuit.

An additional drawback of oxide isolation in general is that there is no longer an electrically active medium from the surface to the underlying substrate. This shortcoming is often circumvented by providing a substrate contact on the backside thereof. Backside processing of the wafer requires special packaging techniques, including alloy mounting of a header to the chip.

For the foregoing, it can be seen that a need exists for a method and structure of isolating adjacent semiconductor circuits which may be shallow or deep, and which requires very little lateral wafer area. There is a concomitant need for a method of isolating adjacent circuits, while at the same time providing an electrical shield therebetween, as well as a surface contact to the underlying substrate.

SUMMARY OF THE INVENTION

In accordance with the present invention, the disclosed isolation technique and structure reduces or eliminates the disadvantages and shortcomings associated with the prior art techniques. According to the isolation technique of the invention, a trench of adequate depth is formed through the active semiconductor material, down to the substrate, and oxidized to form a thin layer of isolating material on the sidewalls thereof. An oxidation barrier, such as a nitride layer, is formed over the surface of the wafer, including the sidewalls and the bottom of the trench.

The wafer is then subjected to a reactive ion etch (RIE) in which the top surface nitride and silicon oxide are removed, as well as the nitride and silicon oxide at the bottom of the trench. The resulting wafer includes a surface layer of silicon nitride which is continuous with the nitride on the trench sidewalls. However, the bottom of the trench comprises an exposed surface of the substrate. The nitride mask formed around the top corners of the trench, provides an oxidation barrier mask to prevent silicon crystallographic dislocations and faults which could otherwise result during subsequent and necessary oxidation processing of the wafer.

A conformal layer of highly doped polycrystalline silicon (polysilicon) is then deposited over the surface of the wafer with a thickness sufficient to completely fill the trench. Significantly, the conductive polysilicon is in electrical contact at the bottom of the trench with the underlying substrate. The conformal layer of polysilicon is planarized to provide a surface suitable for subsequent circuit fabrication, which may include multiple oxidation steps.

The technical advantage afforded this technique is that the nitride layer covering the upper trench corners avoids the bidirectional growth of the silicon causing dislocation centers in the silicon crystal lattice. With the conductive polycrystalline silicon trench material formed in electrical contact with the substrate, the grounding of the substrate, which is typical, provides an electrostatic shield which separates the circuits formed on each side of the trench.

In another embodiment of the invention, a top surface contact can be made through the conductive polysilicon of the trench, thereby providing a top surface substrate contact. For very narrow isolation trenches, such as those which may be only 2-3 microns wide, the alignment of a top surface contact thereto is difficult. In the alternative form of the invention, the isolation trench includes in the face of the wafer a semiconductor region adjacent the trench, and formed of a conductivity type opposite that of the epitaxial region. The surface-oriented region provides an increased area on which a conductor can be formed to make contact with the conductive polysilicon of the narrow trench. When the substrate is referenced to a potential, such as by grounding the top conductor, the surface oriented semiconnector region and the underlying epitaxial region form a reverse-biased junction, thereby isolating the top side substrate conductor from the epitaxial region.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts throughout the views, and in which.

DETAILED DESCRIPTION OF THE INVENTION

The following description discloses an isolation trench, and the method of fabrication thereof, formed through various semiconductor layers to an underlying substrate. It should be understood that the semiconductor layers and the impurity types are arbitrary, and are used only to describe the principles and concepts of the invention.

Figure 1:
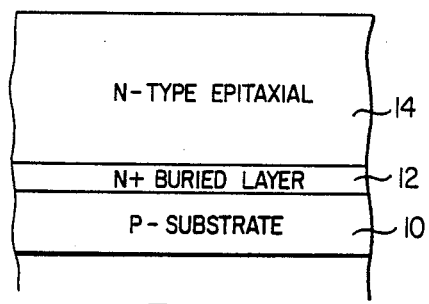
FIGS. 1-7 are sectional views illustrating the steps in fabricating the isolation trench of the invention.

With reference to FIG. 1, an exemplary integrated circuit is formed using a P-type semiconductor substrate 10 as the basis thereof. A heavily doped buried layer 12 is formed on the substrate 10, such as by conventional ion implant and/or deposition processes. The thickness of the epitaxial layer may be nominally 8 microns thick, depending on the type of device desired to be formed therein. The buried layer 12 is shown heavily doped with an N-type impurity which is suitable for use as a buried collector in bipolar transistor circuits. Alternatively, the buried layer 12 can be formed by diffusing an N-type impurity into the P-type substrate so as to form a counter doped surface layer of N-type material.

An additional layer 14 of semiconductor material may be deposited by an epitaxial process on the buried layer 12. The epitaxial layer 14 is shown having an N-type conductivity, which is suitable for use in forming NPN bipolar transistors or P-channel MOSFET transistors. The epitaxial layer 14 may be deposited to a thickness of 2-3 microns for low voltage bipolar transistors and MOSFET transistors, or to a greater depth for higher voltage bipolar transistors.

Figure 2:
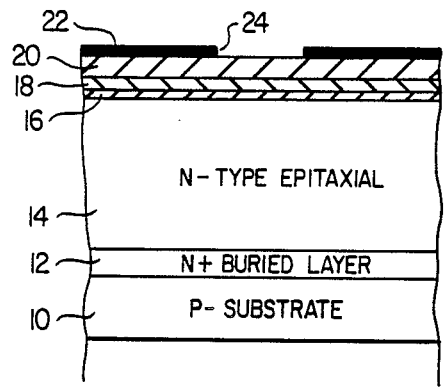

FIG. 2 illustrates the construction of the wafer after a thin silicon dioxide layer 16, a silicon nitride layer 18, and a thicker silicon dioxide layer 20 have been formed on the surface of the epitaxial layer 14. The silicon dioxide layer 16 is formed with a thickness of about 1,000 angstroms by the oxidation of a top surface of the epitaxial layer 14 in the presence of oxygen. The silicon nitride layer 18 can be deposited to a thickness of about a 1,000 angstroms by a low pressure chemical vapor deposition (LPCVD) process over the surface of the silicon dioxide 16. The silicon dioxide layer 16 is formed over the surface of the epitaxial layer 14 before the nitride layer 18 to prevent contact thereof to the epitaxial material 14. The silicon nitride layer 18 forms an oxidation barrier which prevents the top surface of the epitaxial layer 14 from being converted into silicon dioxide during subsequent oxidation process steps.

A thick layer 20 of silicon dioxide is deposited over the silicon nitride layer 18 for use during subsequent etching to form a trench. The silicon dioxide 20 may be formed to a thickness of 14,000-15,000 angstroms, by the conventional decomposition of tetraethoxysilane (TEOS). A photoresist mask layer 22 is next spun, or otherwise deposited, over the surface of the deposited silicon dioxide 20. The photoresist mask layer 22 is patterned to form an opening 24 for defining the location of the trench. While the cross sectional view of FIG. 2 illustrates a single opening, in practice, the patterned photoresist mask 22 would define the trench opening encircling an underlying epitaxial region in which it is desired to form a circuit.

The wafer is subjected to a dry etch, such as by a reactive ion etch, to remove that portion of the silicon dioxide layers 16 and 20 and that portion of the silicon nitride layer 18 defined by the trench opening 24. The photoresist mask layer 22 is then removed.

Figure 3:
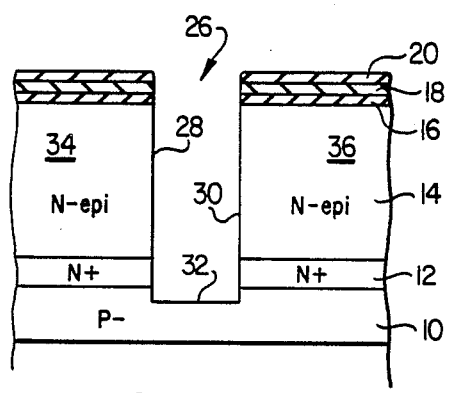

With regard to FIG. 3, the reactive ion etch process is continued until a trench 26, with vertical sidewalls 28 and 30 and a bottom 32, have been formed in the underlying semiconductor layers. By the use of the reactive ion etch process, nearly vertical trench sidewalls 28 and 30 are formed. Depending on the opening defined by the mask layer 22, the trench width may be as small as 2-3 microns. It can be appreciated that by forming an isolation of such dimensions, a minimal amount of lateral wafer area is used for isolation purposes. Moreover, with square upper trench corners formed by the epitaxial material 14, the isolation trench area required is reduced over that used in tapering the trench corners as disclosed in the prior art. A majority of the wafer area may thus be used in fabricating the devices of circuits, thereby optimizing the use of the wafer for the circuits themselves.

As further noted in FIG. 3, the trench 26 is formed through the epitaxial layer 14 and the heavily doped buried layer 12 down to the substrate 10. Indeed, a portion of the substrate material defines the bottom surface 32 of the trench 26. By separating the epitaxial and buried layers 14 and 12 with the trench 26, plural isolated semiconductor regions are formed, each of which can be used for fabricating therein independently operating circuits. It is to be noted, however, that the substrate 10 remains common to all isolated semiconductor layers. The independent semiconductor regions, commonly termed wells or tanks, are illustrated as reference characters 34 and 36.

Figure 4:
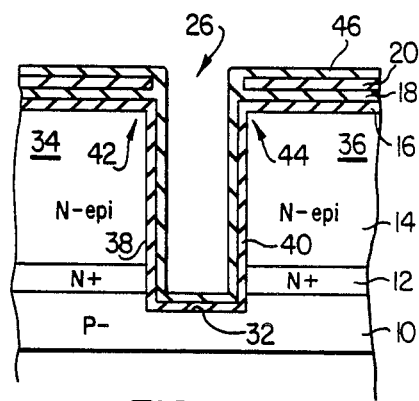

As illustrated in FIG. 4, the wafer is again subjected to an oxidizing environment, in which a thin silicon dioxide layer 38 and 40 is formed on the respective sidewalls 28 and 30 of the trench 26. The sidewall silicon dioxide 38 and 40 is formed to about the the same depth as that of the surface layer 16, the two layers becoming merged or linked together at the external square trench corners 42 and 44. The original top surface silicon nitride layer 18 functions as an oxidation barrier, thereby preventing an additional growth of silicon dioxide on the top surface of the epitaxial regions 34 and 36.

An additional layer 46 of silicon nitride is deposited over the surface of the wafer including the trench sidewall oxide 38 and 40, as well as on the oxidized bottom 32 of the trench 26. The nitride layer 46 links with the original nitride layer 18 to form plural homogeneous layers.

Figure 5:
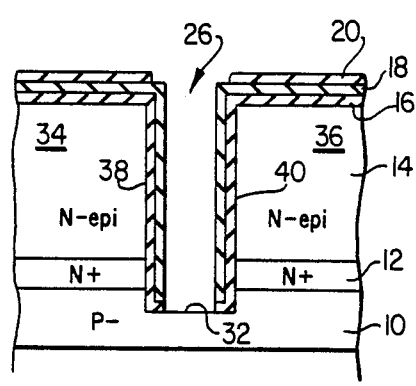

Turning now to FIG. 5, the wafer is illustrated in cross-section as it would appear after an additional reactive ion etch. The reactive ion etch process is anisotropic in nature, e.g., it is effective in unidirectionally removing material In the present situation, material is selectively removed in the downward direction, thereby removing the laterally disposed layer of silicon nitride 46 formed on the top surface of the wafer, as well as that on the bottom 32 of the trench. The reactive ion etch process is continued until the oxide on the trench bottom 32 is also removed, leaving an exposed surface of the substrate 10. A further portion of the deposited dioxide layer 20 is removed by the dry etch. However, the removal of the deposited dioxide 20 is inconsequential, as its sole purpose is to protect the underlying nitride layer 18 from removal by the various etching steps.

Figure 6:
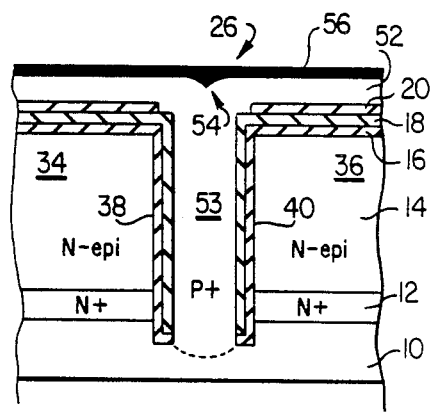

Shown in FIG. 6, a conformal layer of P' doped in situ polysilicon is next deposited by an LPCVD process over the surface of the wafer. The polysilicon is deposited to a depth sufficient to close in the sidewalls of the trench 26, and thus completely fill it. Importantly, the doped polysilicon at the bottom of the trench 26 merges or links, both physically and electrically, with the semiconductor substrate material 10. As a result, the conductive polysilicon 53 filling the trench 26 is in electrical contact with the substrate 10. Due to the conformal nature of the polysilicon deposition 52, a cusp 54 is formed over the trench 26.

The polysilicon refill 53 can be deposited as heavily doped P' in situ material, or selectively deposited in layers with alternate diffusing or implanting with a P-type impurity to fill the trench 26. Other trench refill techniques may be utilized, including filling the trench 26 with intrinsic polysilicon, and diffusing a dopant therethrough to the underlying substrate 10.

In order to remove the polysilicon material 52 generally overlying the semiconductor regions 34 and 36, a photoresist material 56 is spun over the surface of the wafer. The photoresist material 56 is generally nonconformal, thereby leaving a flat top surface. A dry etch process is developed such that the etch rate of the photoresist is the same as that of the polysilicon material 52. Thus, when the wafer is subjected to the dry etch planarization process, the surface of the wafer is gradually and evenly removed, thus eliminating the cusp 54. The planarization etch is continued until the polysilicon layer 52 is removed in the areas overlying the deposited silicon dioxide layer 20. Once a large amount of silicon dioxide 20 is detected in the species of the etch system, it is known that all the polysilicon 52 has been removed. The etch process is then halted, and the only polysilicon which remains is that which exists in the trench 26. The remaining silicon dioxide 20 can be removed by other conventional etching processes.

Figure 7:
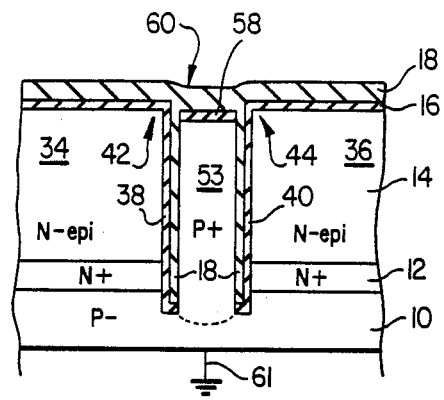

As shown in FIG. 7, the wafer is subjected to an oxidizing environment in which a thin dioxide cap 58 is formed on top of the trench polysilicon 53. Because the remaining surface areas of the wafer are covered by the original nitride layer 18, further silicon dioxide growth does not occur elsewhere. The cap dioxide 58 is grown to about the same depth as that of the dioxide layer 16. An additional layer 60 of silicon nitride is formed over the surface of the wafer, linking with that of the original nitride layer 18.

The wafer is then ready for subsequent processing to fabricate circuits in the epitaxial regions 34 and 36. Importantly, and as noted above, subsequent wafer processing including high temperature oxidation steps can be performed without concern of silicon crystal dislocations forming at the external square trench corners 42 and 44. In accordance with another technical advantage of the invention, when the substrate 10 is connected to a circuit potential, such as ground 61, the conductive polysilicon 53 of the trench is also at a ground potential, and thereby provides an electrostatic shield between epitaxial regions 34 and 36. This is important in reducing the potential electrical coupling between such regions 34 and 36 due to a parasitic FET transistor, wherein a nonconductive trench refill could function as the gate insulator of the parasitic transistor. This can occur in situations where semiconductor regions, such as those forming a vertical bipolar transistor, can function as FET transistor features on one side of the trench. In this situation, a potential applied to the semiconductor region on the other side of the trench can cause a FET conduction channel to form between spaced apart regions of a bipolar transistor located on such other side.

Figure 8:
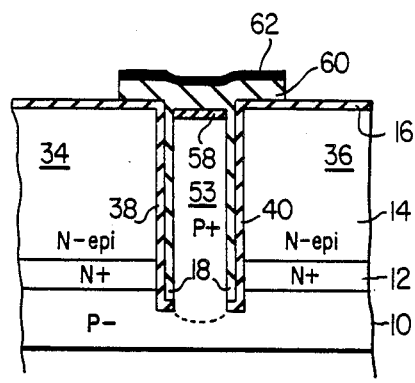
FIG. 8-11 are sectional views of an alternative isolation trench of the invention, having a top surface contact formed through the trench to the substrate.

In accordance with another significant feature of the invention, a topside substrate contact can be made employing the conductive material 53 of the trench refill. The topside contact requires no additional mask steps, but can be formed by the same steps used in fabricating the remainder of the integrated circuit. For example, when semiconductor tanks or wells are formed elsewhere in the integrated circuit, a photoresist mask layer 62 can be deposited on the wafer over the area defining a contact to the trench refill 53. The resist material 62 is patterned, as shown in FIG. 8. The patterned photoresist 62 is patterned to cover underlying semiconductor areas in the respective epitaxial regions 34 and 36 for providing an expanded lateral contact area for a topside substrate contact. The portion of the original silicon dioxide layer 16 exposed by the mask 62 is removed by an etch process. After removing the unmasked silicon nitride 60, the photoresist 62 is removed. The nitride pad 60 generally overlying the trench area provides an oxidation mask so that silicon oxide does not grow in the area covered by the patterned nitride.

Figure 9:
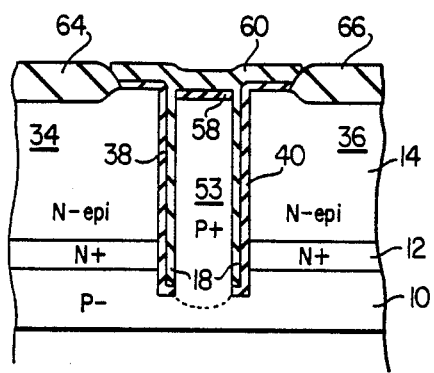

The wafer is next subjected to an oxidizing environment in which a thick field oxide 64 and 66 is grown in the areas not covered by the nitride oxidation barrier 60. This step is depicted in FIG. 9. The field oxide 64 and 66 becomes homogenous with the oxide layer 16.

The wafer is then etched by suitable processes to remove the nitride oxidation mask 60 and the thin silicon oxide 58 covering the trench refill 53. As a result, the trench refill is exposed, as are surface areas of the epitaxial regions 34 and 36 adjacent the trench.

Figure 10:
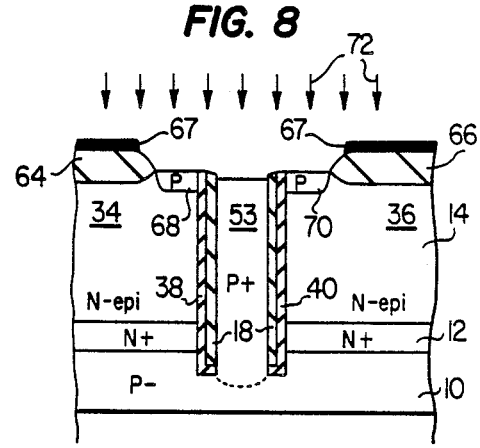

In FIG. 10, an additional photoresist 67 is shown spun over the wafer and patterned to open the trench area as shown. Heavily doped P-type semiconductor areas 68 and 70 are formed in the faces of the respective epitaxial regions 34 and 36 by an ion implantation 72. The trench refill 53 is unaffected by the implantation as it is already heavily doped with a P-type impurity. Boron, or other similiar impurities, may be used to form the implanted P-type regions 68 and 70. The photoresist mask 67 functions as a barrier to prevent the implantation of the P-type impurity in other areas of the wafer. The photoresist 67 is removed after the implant, and then the ions are activated by annealing the wafer. While ion implantation is preferable in forming the lateral conductive areas 68 and 70, a diffusion process may be employed in lieu thereof.

After all circuits are formed, the topside substrate is metallized along with the conventional metallization of the wafer circuits. In the patterning step of the metallization, an opening is formed in the area above the trench refill 53 and the semiconductor regions 68 and 70.

Figure 11:
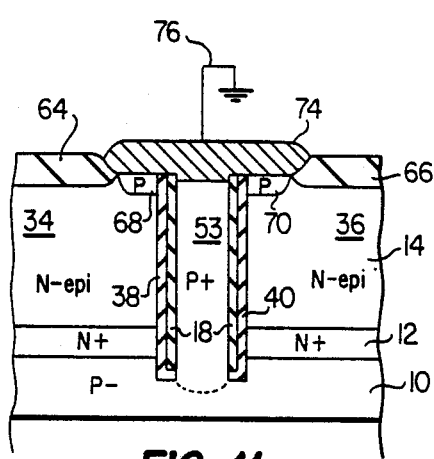

As shown in FIG. 11, a layer of conductive material or metal is formed over the surface of the wafer, masked and patterned (not shown) to form the contact electrode 74 over the conductive trench refill 53. In situations where the trench itself is very narrow, the additional lateral conductive areas 68 and 70 allow for a certain amount of misallignment of the contact electrode 74 while yet enabling it to make contact with the narrow trench refill 53. The contact electrode 74 can then be grounded 76 to thereby provide a ground potential to the substrate 10 through the conductive polysilicon refill 53 of the trench. With lateral areas 68 and 70 being of the P-type conductivity, a reverse-biased junction is formed between such areas and the corresponding epitaxial regions 34 and 36, thereby maintaining the contact electrode 78 electrically isolated from the active semiconductor regions 34 and 36.

The topside substrate contact of FIG. 11 is preferrably formed as the last step in the wafer fabrication process, using the same process masks and metallization steps as the other circuits of the integrated circuit. Since the metallization steps are conducted at temperatures considerably lower than the silicon oxidation steps, the risk of forming crystal faults is reduced.

TECHNICAL ADVANTAGES OF THE INVENTION

From the foregoing, a method and structure have been disclosed for fabricating an isolation trench in a semiconductor circuit. One technical advantage of the trench structure arises from the oxidation barrier which protects the adjacent semiconductor regions from crystal faults and dislocations caused by high temperature oxidizing processes. Another technical advantage of the invention is the conductive refill of the trench which is in electrical contact with a substrate. The conductive trench refill functions as an electrostatic shield between adjacent semiconductor regions, thereby reducing electrical interference and parasitic transistor action therebetween. An additional technical advantage of the invention associated with the conductive refill of the trench is the feature which permits topside connections to the wafer substrate. A contact electrode formed on the top surface of the wafer, in contact with the conductive refill material of the trench, and indirectly with the underlying substrate, allows a potential at the top of the wafer to be applied to the substrate.

It is to be understood that the steps described herein are merely illustrative applications of the principles and concepts of the invention, and that numerous other steps or materials may be utilized by those skilled in the art without departing from the spirit and scope of the invention.

What is claimed is:

1. A semiconductor structure with insulated areas, comprising:
    (a) a semiconductor substrate of a first conductivity type;

(b) an epitaxial layer of semiconductor material formed on said substrate and comprising a material of a second conductivity type;

(c) a trench in said epitaxial layer and extending therethrough to said substrate for defining two semiconductor regions of said semiconductor material each on an opposite side of said trench;

(d) a conductive semiconductor material of said first conductivity type filling said trench and in electrical contact at the bottom of said trench with said substrate;

(e) an insulating layer formed on the sidewalls of said trench between said conductive semiconductor material filling said trench and said epitaxial layer of semiconductor material for providing electrical isolation between said two semiconductor regions in said epitaxial layer and said conductive semiconductor material filling said trench;

(f) a semiconductor area of said first conductivity type formed in a face of said layer of semiconductor material of said second conductivity type and adjacent said conductive semiconductor material filling said trench;

(g) a topside contact having a width greater than the width of said trench and being formed in electrical contact with the top end of said trench filling material and said semiconductor area.

2. The semiconductor structure of claim 1 wherein said topside contact is connected to a circuit ground.

3. The semiconductor structure of claim 1 wherein said trench is a narrow trench having a width of about 2-3 microns.

4. A trench isolated semiconductor structure, comprising:

(a) a substrate of a given conductivity type having an epitaxial layer of an opposite conductivity type disposed thereon;

(b) an isolation trench formed in said epitaxial layer and extending therethrough to said substrate for providing lateral electrical isolation between first and second regions of said epitaxial layer on opposite sides of said trench;

(c) a conductive semiconductor material of the same conductivity type as said substrate filling said trench and in electrical contact at the bottom of said trench with said substrate;

(d) an insulating layer formed on each sidewall of said trench between said conductive material filling said trench and said epitaxial layer for providing electrical isolation between said conductive material filling said trench and said first and second regions of said epitaxial layer, said insulating layer comprising an oxide layer disposed on said sidewalls and a nitride layer disposed on said oxide layer;

(e) a topside contact formed over said trench and in electrical contact with said conductive material filling said trench, said contact having a width greater than said trench, a portion of said contact overlying said epitaxial layer; and (f) a semiconductor region of the same conductivity type as said substrate and disposed in a face of said epitaxial layer adjacent to each upper corner of said trench for providing electrical isolation between said epitaxial layer and said portion of said contact overlying said epitaxial layer.

5. A trench isolated semiconductor structure as recited in claim 4 wherein said trench is a narrow trench having a width of about $2 \leq 3$ microns.

* * * * *